(12) United States Patent
Jo et al.

(10) Patent No.: US 7,824,838 B2
(45) Date of Patent: Nov. 2, 2010

(54) METHOD OF MANUFACTURING PRINTED CIRCUIT BOARD

(75) Inventors: Ji-Hong Jo, Chungcheongnam-do (KR); Shuhichi Okabe, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 350 days.

(21) Appl. No.: 12/068,125

(22) Filed: Feb. 1, 2008

(65) Prior Publication Data

US 2008/0261158 A1 Oct. 23, 2008

(30) Foreign Application Priority Data

Apr. 23, 2007 (KR) ........................ 10-2007-0039390

(51) Int. Cl.
G03F 7/00 (2006.01)
G03F 7/26 (2006.01)
G03F 7/40 (2006.01)

(52) U.S. Cl. ............... 430/270.1; 430/311; 430/5; 430/330; 430/322; 264/227

(58) Field of Classification Search ............... 430/311, 430/330, 5, 322; 264/227
See application file for complete search history.

(56) References Cited

U.S. PATENT DOCUMENTS

| | | | |
|---|---|---|---|
| 4,826,705 A * | 5/1989 | Drain et al. ............... 427/510 |
| 5,178,989 A * | 1/1993 | Heller et al. ............... 430/323 |
| 5,496,682 A * | 3/1996 | Quadir et al. ............... 430/269 |
| 6,580,172 B2 * | 6/2003 | Mancini et al. ............... 257/762 |
| 7,063,762 B2 * | 6/2006 | Foster et al. ............... 156/150 |
| 7,335,521 B2 * | 2/2008 | Dubs et al. ............... 438/22 |
| 7,644,496 B2 * | 1/2010 | Kwak et al. ............... 29/846 |
| 7,662,299 B2 * | 2/2010 | Subramanian et al. ........ 216/11 |
| 2005/0151283 A1 * | 7/2005 | Bajorek et al. ............... 264/1.33 |
| 2005/0167272 A1 * | 8/2005 | Chen et al. ............... 205/69 |
| 2005/0202196 A1 * | 9/2005 | Katoh et al. ............... 428/40.1 |
| 2006/0134338 A1 * | 6/2006 | Chen et al. ............... 427/402 |
| 2006/0199380 A1 * | 9/2006 | Liu et al. ............... 438/638 |
| 2007/0098966 A1 * | 5/2007 | Zhou ............... 428/209 |
| 2007/0099323 A1 * | 5/2007 | Chang et al. ............... 438/30 |
| 2008/0054518 A1 * | 3/2008 | Ra et al. ............... 264/227 |
| 2008/0057444 A1 * | 3/2008 | Ra et al. ............... 430/322 |
| 2008/0131791 A1 * | 6/2008 | Cho et al. ............... 430/5 |
| 2008/0315459 A1 * | 12/2008 | Zhang et al. ............... 264/338 |
| 2009/0123877 A1 * | 5/2009 | Shih et al. ............... 430/322 |
| 2009/0136657 A1 * | 5/2009 | Slafer ............... 427/124 |
| 2009/0183903 A1 * | 7/2009 | Lee et al. ............... 174/257 |

* cited by examiner

*Primary Examiner*—Amanda C. Walke

(57) ABSTRACT

A method of manufacturing a printed circuit board is disclosed. The method includes: forming a relievo pattern and an intaglio pattern on a surface of a base plate; forming a metal plate, which has a metal pattern that corresponds with a shape of the relievo pattern and the intaglio pattern, by plating a surface of the relievo pattern and a surface of the intaglio pattern; separating the metal plate from the base plate; pressing the metal plate onto an insulation layer with the metal pattern facing the insulation layer; and removing a portion of the metal plate such that the metal pattern is exposed. Since this method does not use carriers, there is no need for a chemical etching process for carrier removal.

8 Claims, 15 Drawing Sheets

METHOD OF MANUFACTURING PRINTED CIRCUIT BOARD

CROSS-REFERENCE TO RELATED APPLICATIONS

This application claims the benefit of Korean Patent Application No. 10-2007-0039390 filed with the Korean Intellectual Property Office on Apr. 23, 2007, the disclosure of which is incorporated herein by reference in its entirety.

BACKGROUND

1. Technical Field

The present invention relates to a method of manufacturing a printed circuit board.

2. Description of the Related Art

Previous methods for manufacturing a printed circuit board having buried patterns include forming a plating layer on a metal plate known as a carrier, and performing plating again over such the plating layer to form a metal pattern. The plating layer and the carrier, excluding the metal pattern, have to be removed. Here, in consideration of possible reactions between the carrier and the plating layer, the removal has to be performed twice, each with different liquids. As a result, the procedures using supplementary materials (e.g. the carrier) for forming and removing the materials may cause high losses in the process, and the procedures for removing the different materials may affect the actual main product, i.e. the metal pattern, to result in lower reliability.

Furthermore, as the metallic carrier has a high coefficient of thermal expansion, there is a risk of warpage or bending at the interface to a different material during the manufacturing process.

SUMMARY

An aspect of the invention is to provide a method of manufacturing a printed circuit board, by which a buried circuit pattern can be formed without the use of chemical etching and without the use of carriers.

One aspect of the invention provides a method of manufacturing a printed circuit board. The method includes: forming a relievo pattern and an intaglio pattern on a surface of a base plate; forming a metal plate, which has a metal pattern that corresponds with a shape of the relievo pattern and the intaglio pattern, by plating a surface of the relievo pattern and a surface of the intaglio pattern; separating the metal plate from the base plate; pressing the metal plate onto an insulation layer with the metal pattern facing the insulation layer; and removing a portion of the metal plate such that the metal pattern is exposed. Since this method does not require a carrier, there is no need for a chemical etching process for carrier removal.

Forming the relievo pattern and the intaglio pattern can be achieved by stacking a photosensitive film on a surface of the base plate and removing a portion of the photosensitive film to form the relievo pattern and the intaglio pattern. Here, stacking the photosensitive film and removing the portion of the photosensitive film may include: stacking a first photosensitive film on a surface of the base plate and curing the first photosensitive film by exposure; stacking a second photosensitive film on the first photosensitive film; and removing a portion of the second photosensitive film by an exposure and development process. In certain embodiments, an operation may further be included, after removing the portion of the second photosensitive film by an exposure and development process, of re-exposing the remaining second photosensitive film to ultraviolet rays that are stronger than those used for the exposure process.

Furthermore, after forming the relievo pattern and the intaglio pattern, the method may further include forming a seed layer on a surface of the relievo pattern and a surface of the intaglio pattern, in which case forming the seed layer can be achieved by coating the surface of the relievo pattern and the surface of the intaglio pattern with conductive particles. The conductive particles can include graphite, silver (Ag), gold (Au), nickel, and platinum, etc.

In certain embodiments, separating the metal plate from the base plate may include: attaching a board, to which an adhesive material is attached, to the metal plate; and separating the metal plate from the base plate using the adhesion of the adhesive material.

Additional aspects and advantages of the present invention will be set forth in part in the description which follows, and in part will be obvious from the description, or may be learned by practice of the invention.

BRIEF DESCRIPTION OF THE DRAWINGS

FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, FIG. 2M, and FIG. 2N are cross-sectional views representing a flow diagram for a process of manufacturing a printed circuit board according to an embodiment of the invention.

DETAILED DESCRIPTION

Figure 1:
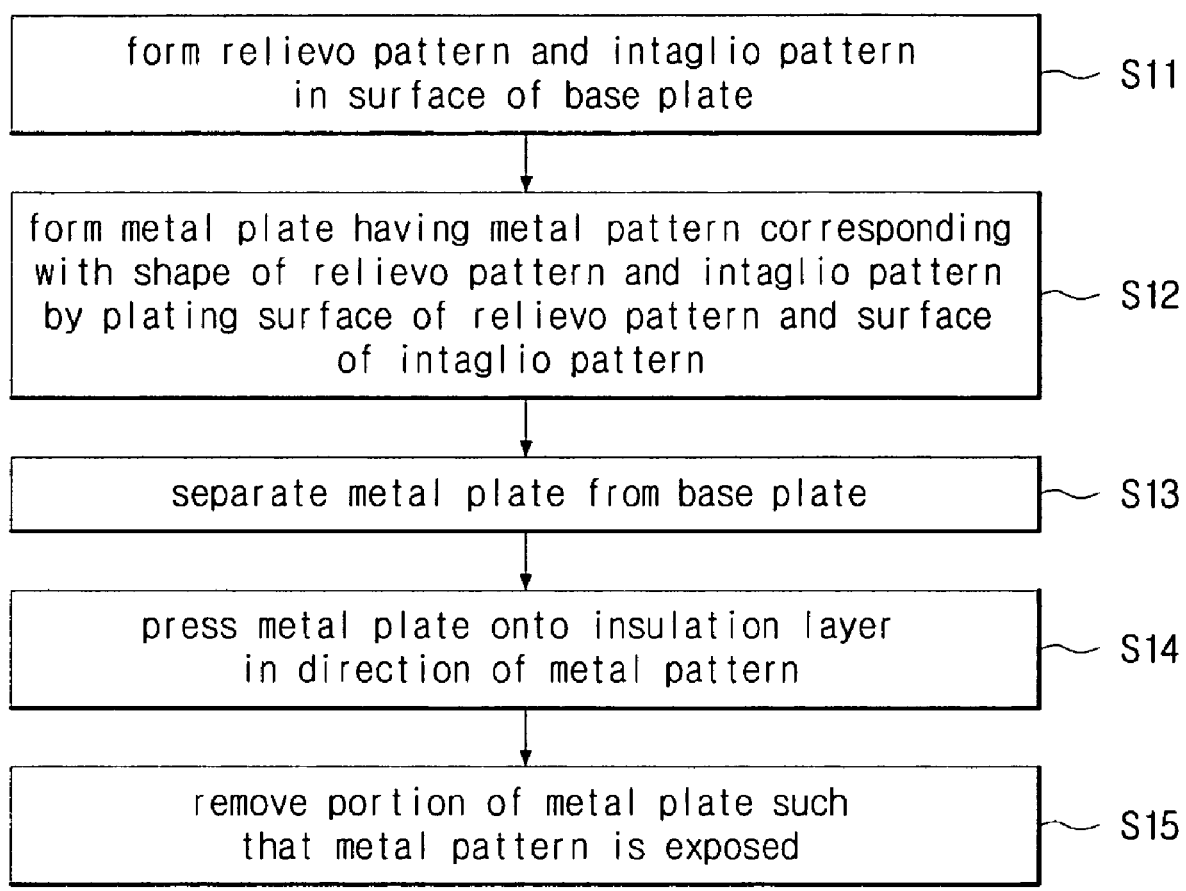
FIG. 1 is a flowchart for a method of manufacturing a printed circuit board according to an embodiment of the invention.

The method of manufacturing a printed circuit board according to certain embodiments of the invention will be described below in more detail with reference to the accompanying drawings. Those components that are the same or are in correspondence are rendered the same reference numeral regardless of the figure number, and redundant explanations are omitted.

Figure 2A:
Figure 2B:
Figure 2C:
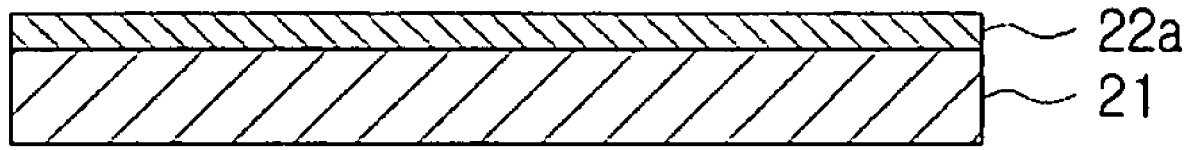
Figure 2D:
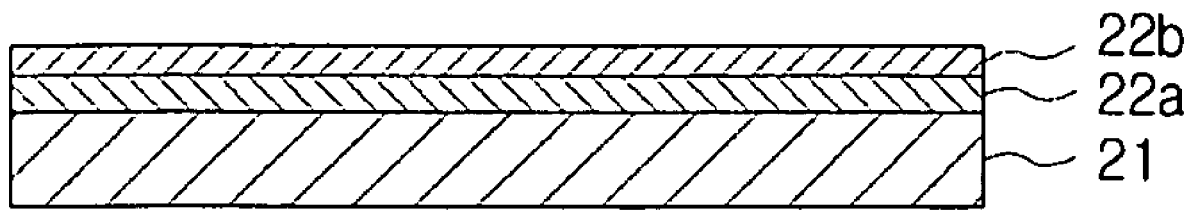
Figure 2E:
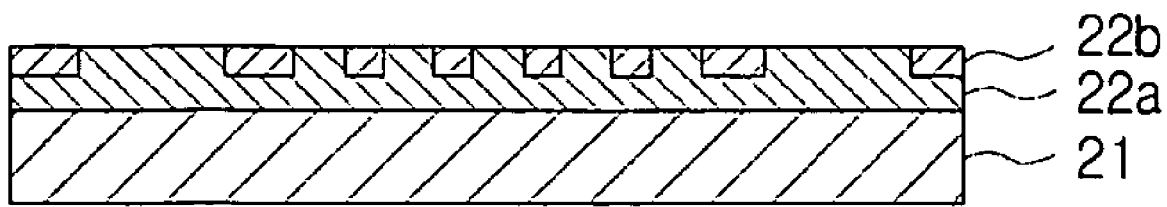
Figure 2F:
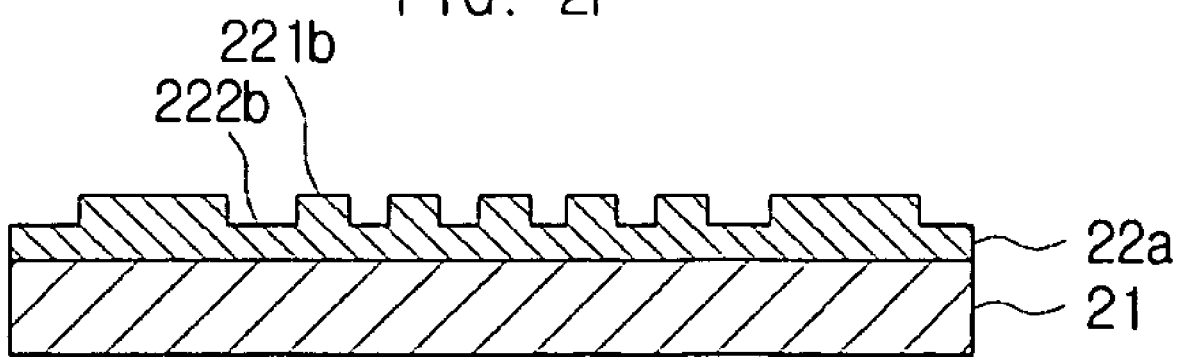
Figure 2G:
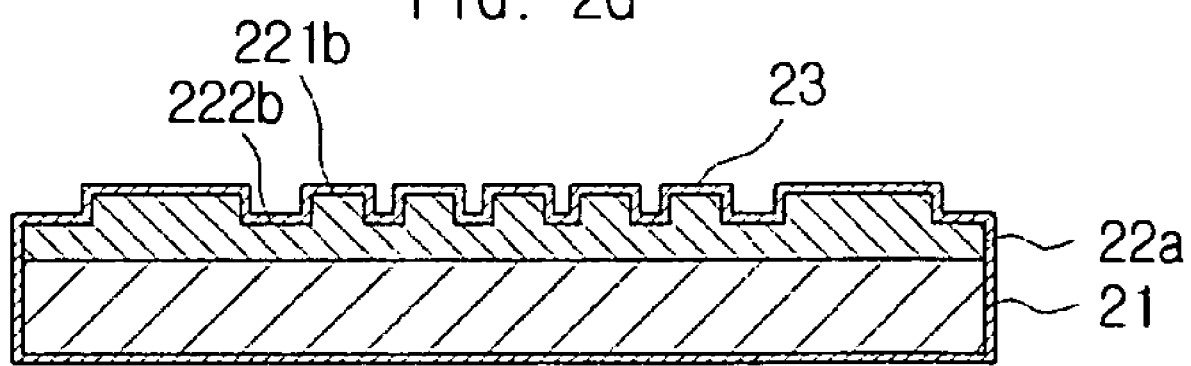
Figure 2H:
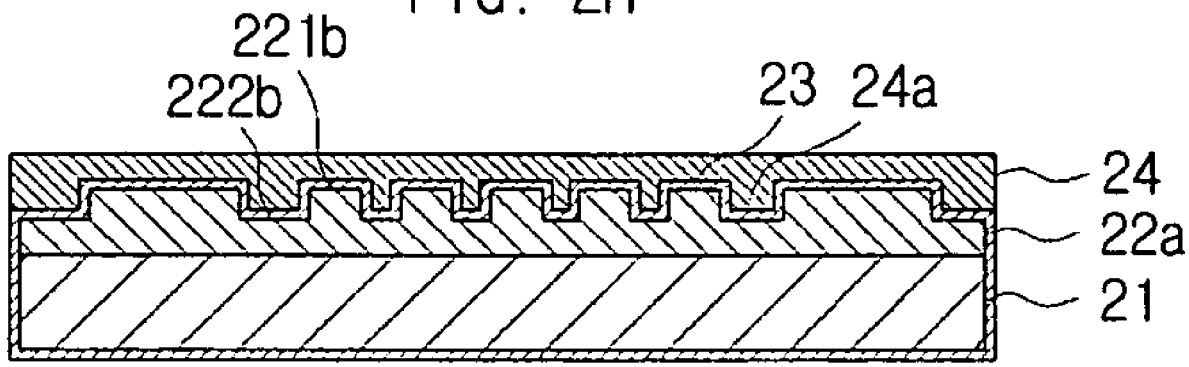
Figure 21:
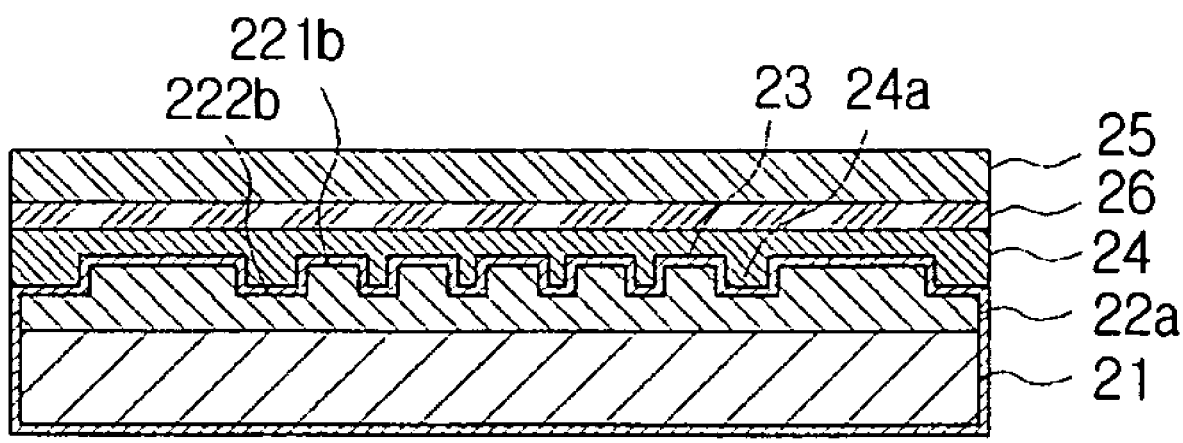
Figure 2J:
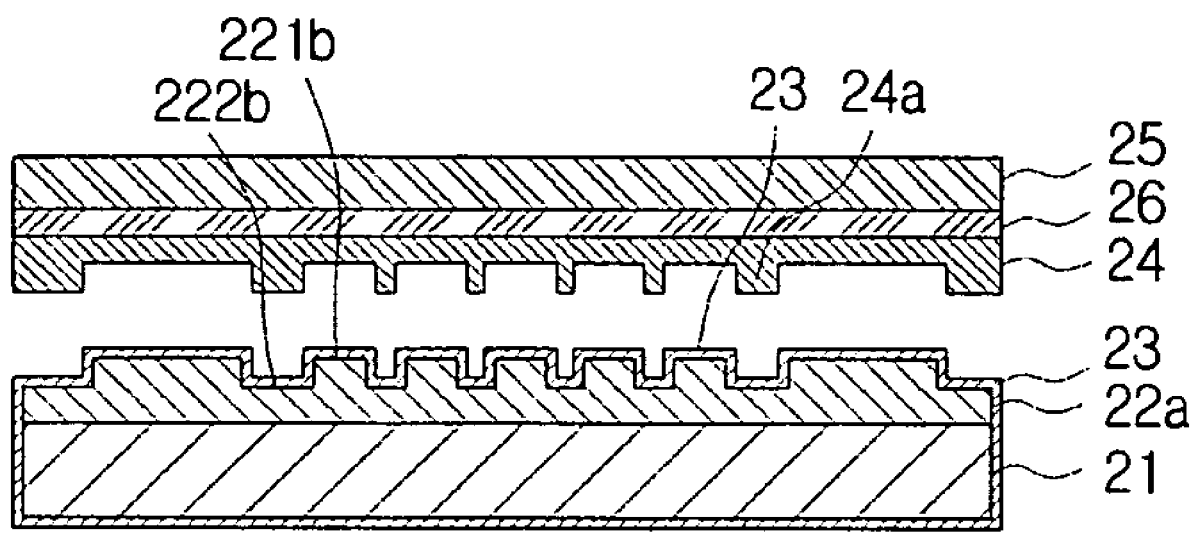
Figure 2K:
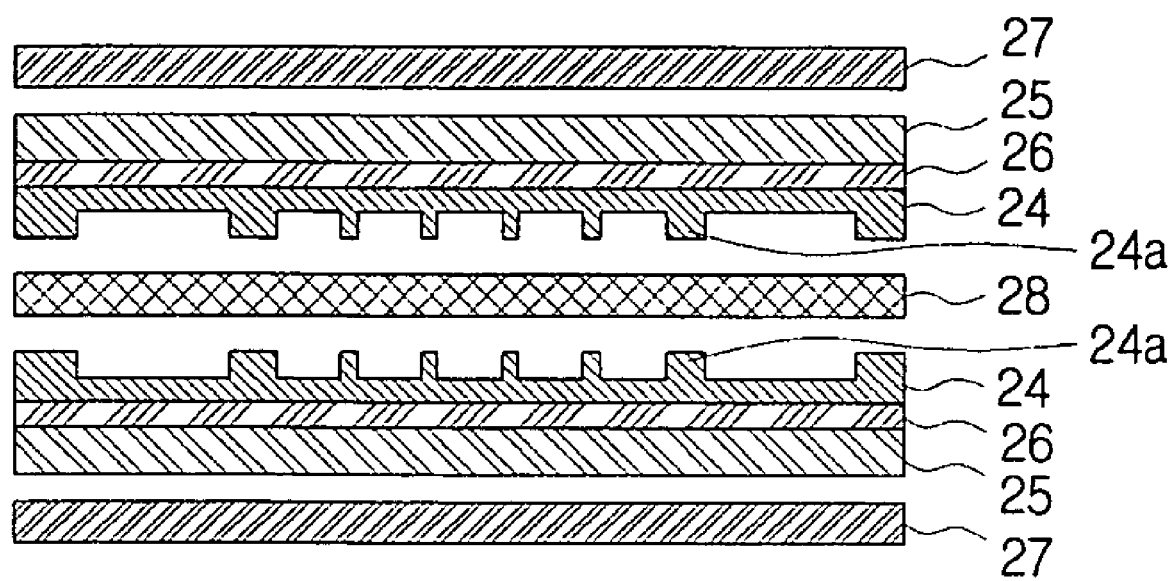
Figure 2L:
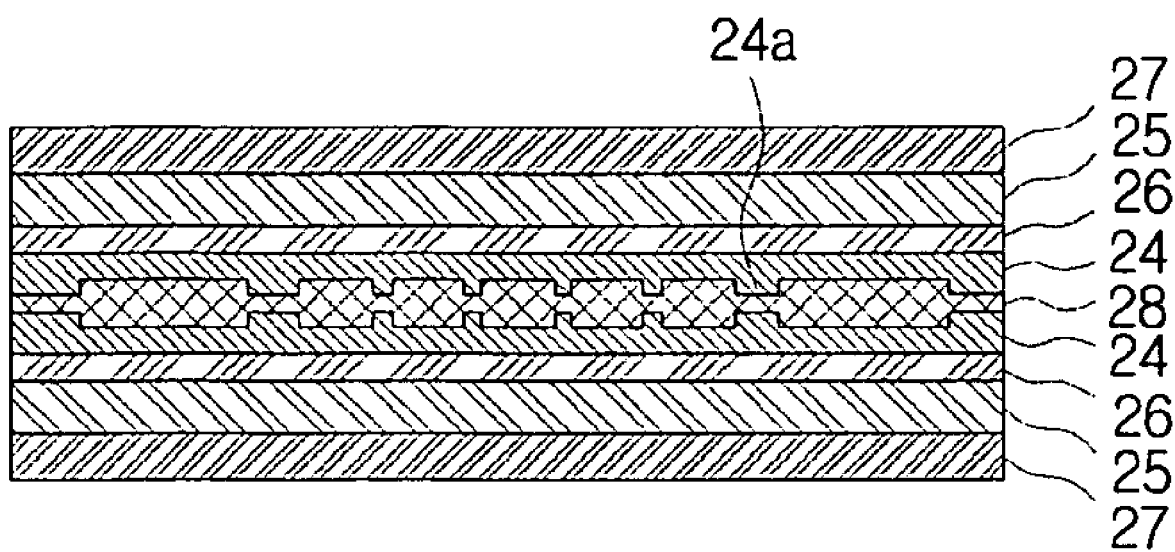
Figure 2M:
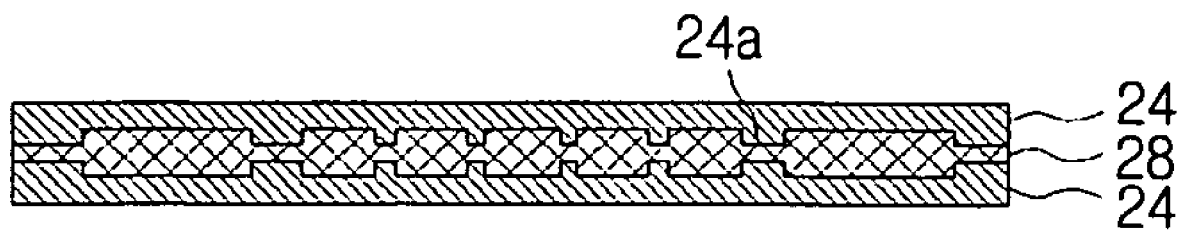
Figure 2N:
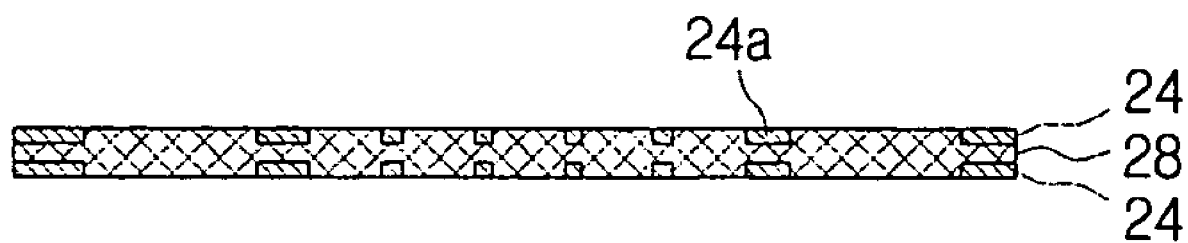

FIG. 1 is a flowchart for a method of manufacturing a printed circuit board according to an embodiment of the invention, while FIG. 2A through FIG. 2N are cross-sectional views representing a flow diagram for a process of manufacturing a printed circuit board according to an embodiment of the invention. In FIGS. 2A to 2N are illustrated base plates 21, a first photosensitive film 22a, a second photosensitive film 22b, a relievo pattern 221b, an intaglio pattern 222b, a seed layer 23, metal plates 24, metal patterns 24a, panels 25, adhesive material 26, and pressing plates 27.

Operation S11 of FIG. 1 may include forming a relievo pattern and an intaglio pattern on a surface of a base plate, where FIGS. 2A to 2F represent examples of corresponding processes.

As shown in FIG. 2A, a base plate 21 may be prepared. In certain cases, it may be desirable to have at least one side of the base plate 21 be flat. A resin material such as epoxy can be used for the base plate 21, since epoxy has a low coefficient of thermal expansion and thus may not easily be warped or bent when stacking another material. Of course, any of various other materials having a low coefficient of thermal expansion, other than epoxy, can be used just as well.

FIG. 2B illustrates a process of stacking a first photosensitive film 22a on the surface of the base plate 21. The photosensitive film can be such that is cured by heat or irradiation. When it is cured, as in FIG. 2C, the rigidity of the first photosensitive film 22a may be increased. In the example illustrated in FIG. 2C, the curing temperature may be between 130 to 200° C. However, the curing may be performed under various temperature and/or exposure conditions according to the type of photosensitive film. In other embodiments, any of a variety of resins other than photosensitive film can be used.

By forming this first photosensitive film 22a from the same material as that of the second photosensitive film 22b, which will be stacked on later, the difference in coefficients of thermal expansion can be eliminated, making it possible to form the patterns with greater precision.

FIGS. 2D, 2E, and 2F illustrate the processes of stacking the second photosensitive film 22b on the first photosensitive film 22a and performing exposure and development to form a relievo pattern 221b and an intaglio pattern 222b. That is, using a mask (not shown), portions of the second photosensitive film 22b that are to remain can be exposed, while the portions that are to be removed can be covered. Here, the amount of exposure can advantageously be set to 100 to 250 mJ/cm$^2$. However, this amount may vary according to the type of photosensitive film. When the exposure is completed, developing may be performed to remove the uncured portions of the second photosensitive film 22b. This may result in the form illustrated in FIG. 2F.

Afterwards, the exposure process may be performed once more (re-exposing). The exposure process here can be for increasing the rigidity of the first and second photosensitive films 22a, 22b, and can be performed with ultraviolet rays that are more intense than the rays used for the previous exposure process. The exposure conditions here can include an amount of irradiation advantageously set to 800 to 1200 mJ/cm$^2$. The temperature can be set to 130 to 200° C., to simultaneously perform thermal curing.

Operation S12 of FIG. 1 may include plating a surface of the relievo pattern and a surface of the intaglio pattern to form a metal plate that includes a metal pattern corresponding with the shape of the relievo pattern and the intaglio pattern, where FIGS. 2G and 2H represent examples of corresponding processes.

As shown in FIG. 2G, this may be an operation of forming a seed layer 23 on the surface of the relievo pattern 221b and the surface of the intaglio pattern 222b. The process of forming the seed layer 23 may be for coating the non-conductive surface of the relievo pattern 221b and intaglio pattern 222b with conductive material, to facilitate the subsequent plating process. The seed layer 23 can be formed by electroless plating, or other methods can be used, such as of sputtering conductive particles. These conductive particles can include at least one of graphite, silver (Ag), gold (Au), nickel, and platinum.

Afterwards, a process may be performed of forming a metal plate 24 by plating, as illustrated in FIG. 2H. As there may be a seed layer 23 formed already, the metal plate 24 may be formed by electroplating. Since the plating may be performed according to the shapes of the relievo pattern 221b and intaglio pattern 222b, a metal pattern 24a may consequently be formed that corresponds with the shapes of the relievo pattern 221b and intaglio pattern 222b. The metal plate 24 may also be formed using electroless plating, although in some cases, this can be less efficient.

Operation S13 of FIG. 1 may include separating the metal plate from the base plate, where FIGS. 2I and 2J represent examples of corresponding processes. The base plate 21 may serve to support the relievo pattern 221b and intaglio pattern 222b, while the relievo pattern 221b and intaglio pattern 222b may serve as a cast in forming the metal pattern 24a in the metal plate 24. With the metal plate 24 formed by the plating process of operation S12, an operation of separating the metal plate 24 and the base plate 21 may be performed in operation S13. While the separating can be achieved by any of a variety of methods, in this particular embodiment, a panel 25 that has an adhesive material 26 attached on one side may be attached to the metal plate 24, after which the base plate 21 can be separated by physical force. The adhesive material 26 can be a synthetic resin commonly used in bonding work. The adhesion of the adhesive material 26 may be strong enough to separate the metal plate 24 from the base plate 21. As a result of this process, the metal plate 24 may be separated as illustrated in FIG. 2J. The separated base plate 21 can be reused.

Operation S14 of FIG. 1 may include pressing and stacking the metal plate in the direction of the metal pattern onto an insulation layer. This is in correspondence with the examples represented in FIGS. 2K, 2L, and 2M.

As shown in FIG. 2K, a pair of metal plates 24 can be arranged with an insulation layer 28 disposed in the middle. Here, operation S14 can be performed with the metal plate 24 still joined to the panel 25. A pair of pressing plates 27 may be positioned on the outside of the pair of metal plates 24, and pressing may be performed with a substantially equal amount of pressure. This process can result in the metal patterns 24a being buried inside the insulation layer 28, as illustrated in FIG. 2L. While a pair of identical metal plates 24 are illustrated in this embodiment, other embodiments may include metal plates that are fabricated independently by separate processes.

Afterwards, the pressing plates 27, panels 25, and adhesive material 26 may be removed. The adhesive material 26 may be such that has different levels of adhesion according to temperature, in which case the panel 27 and the metal plate 24 can be joined or separated by controlling the temperature. Removing the pressing plates 27, panels 25, and adhesive material 26 can result in a configuration similar to that shown in FIG. 2M.

Operation S15 of FIG. 1 may include removing portions of the metal plates to expose the metal patterns 24a. FIG. 2N illustrates an example of a result of such operation.

The insulation-layer 28 can be exposed by gradually removing the exposed metal plates 24. Consequently, the metal pattern 24a may remain, which will function as circuit patterns.

The removing of the portions of the metal plates 24 can be achieved by a method known to those skilled in the art, which may include mechanical abrasion methods and/or chemical abrasion methods.

According to certain embodiments of the invention as set forth above, a printed circuit board having buried patterns (such as the metal patterns in FIG. 2N) can be manufactured without using disposable carriers. Thus, the warping and bending phenomena that may occur when using carriers, due to the chemical etching or thermal changes involved, can be avoided.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a printed circuit board, the method comprising:

forming a relievo pattern and an intaglio pattern on a surface of a base plate;

forming a metal plate having a metal pattern corresponding with a shape of the relievo pattern and the intaglio pattern by plating a surface of the relievo pattern and a surface of the intaglio pattern;

separating the metal plate from the base plate;

pressing the metal plate onto an insulation layer with the metal pattern facing the insulation layer; and removing a portion of the metal plate such that the metal pattern is exposed.

2. The method of claim 1, wherein forming the relievo pattern and the intaglio pattern comprises:

stacking a photosensitive film on a surface of the base plate and removing a portion of the photosensitive film to form the relievo pattern and the intaglio pattern.

3. The method of claim 2, wherein stacking the photosensitive film and removing the portion of the photosensitive film comprises:

stacking a first photosensitive film on a surface of the base plate and curing the first photosensitive film by exposure;

stacking a second photosensitive film on the first photosensitive film; and removing a portion of the second photosensitive film by an exposure and development process.

4. The method of claim 3, further comprising, after removing the portion of the second photosensitive film by an exposure and development process:

re-exposing the remaining second photosensitive film to stronger ultraviolet rays than those used for the exposure process.

5. The method of claim 1, further comprising, after forming the relievo pattern and the intaglio pattern:

forming a seed layer on a surface of the relievo pattern and a surface of the intaglio pattern.

6. The method of claim 5, wherein forming the seed layer comprises:

coating the surface of the relievo pattern and the surface of the intaglio pattern with conductive particles.

7. The method of claim 6, wherein the conductive particles include at least one of graphite, silver (Ag), gold (Au), nickel, and platinum.

8. The method of claim 1, wherein separating the metal plate from the base plate comprises:

attaching a board to the metal plate, the board having an adhesive material attached thereto; and separating the metal plate from the base plate using an adhesion of the adhesive material.

* * * * *